United States Patent
Tachibana et al.

(10) Patent No.: US 7,504,626 B2
(45) Date of Patent: Mar. 17, 2009

(54) SCANNING ELECTRON MICROSCOPE AND APPARATUS FOR DETECTING DEFECT

(75) Inventors: Ichiro Tachibana, Hitachinaka (JP); Mitsugu Sato, Hitachinaka (JP); Atsuko Fukada, Kokubunji (JP); Naomasa Suzuki, Hitachinaka (JP); Muneyuki Fukuda, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 258 days.

(21) Appl. No.: 11/655,264

(22) Filed: Jan. 19, 2007

(65) Prior Publication Data

US 2007/0187598 A1 Aug. 16, 2007

(30) Foreign Application Priority Data

Feb. 15, 2006 (JP) ............................ 2006-037660

(51) Int. Cl.
*H01J 37/28* (2006.01)
(52) U.S. Cl. ...................................................... 250/310
(58) Field of Classification Search ................. 250/310, 250/396 R, 397
See application file for complete search history.

(56) References Cited

U.S. PATENT DOCUMENTS

| 5,149,968 | A | * | 9/1992 | Sato .......................... 250/310 |
| 6,555,819 | B1 | | 4/2003 | Suzuki et al. |
| 6,979,821 | B2 | | 12/2005 | Suzuki et al. |
| 7,161,149 | B2 | * | 1/2007 | Kazumori ................... 250/310 |

FOREIGN PATENT DOCUMENTS

| JP | 2001-110351 A | 4/2001 |
| JP | 2002-83563 A | 3/2002 |

* cited by examiner

*Primary Examiner*—Kiet T Nguyen
(74) *Attorney, Agent, or Firm*—McDermott Will & Emery LLP

(57) ABSTRACT

A scanning electron microscope, by which an image of unevennesses on the surface of a sample may be obtained in a high-resolution manner and a high contrast one, is provided according to the present invention. A sample image is obtained by use of the scanning electron microscope with a configuration in which a positive voltage is applied in order to accelerate a primary electron beam, and an electric field shielding plate, a magnetic field shielding plate, or an electromagnetic field shielding plate is arranged on the upper side of an object lens.

23 Claims, 5 Drawing Sheets

SCANNING ELECTRON MICROSCOPE AND APPARATUS FOR DETECTING DEFECT

BACKGROUND OF THE INVENTION

1. Field of the Invention

The present invention relates to an electron microscope apparatus which is preferably used for detecting a defect in a wafer, and, more particularly, to a scanning electron microscope for image picking-up of unevennesses on the surface of a sample.

2. Description of the Related Art

During processes for manufacturing a semiconductor device, there is executed in-line wafer inspection by which a defect in a wafer is inspected. The defect in the wafer is detected, and a reason for generation of the defect is located by analysis to realize yield improvement and stable operation of production lines.

Conventionally, an optical apparatus for inspecting a defect had been used for inspecting a defect in a wafer, but, recently, there has been used an apparatus for inspecting a defect by use of a scanning electron microscope. The scanning electron microscope may obtain an image of fine unevennesses on the surface of a sample.

Japanese Patent Application Laid-Open No. 2001-110351, and Japanese Patent Application Laid-Open No. 2002-83563 have disclosed a method in which an image of unevennesses on the surface of a sample is obtained by use of a scanning electron microscope.

Recently, a finer production process for manufacturing a semiconductor has also caused a finer defect size. Accordingly, it is required to obtain an image of unevennesses for an image of the surface of a sample in a high-resolution manner and a high contrast one.

SUMMARY OF THE INVENTION

One object of the present invention is to provide a scanning electron microscope by which an image of unevennesses for an image of the surface of a sample may be obtained in a high-resolution manner and a high contrast one.

The scanning electron microscope according to the present invention has an electron source which generates a primary electron beam; an object lens by which the primary electron beam is focused onto a sample; a conductor plate, with which signal electrons generated from the sample collide; a detector which detects secondary electrons generated from the conductor plate; an acceleration-electric-field generating unit which generates an acceleration electric field for accelerating the signal electrons; and a shielding plate arranged on the upper side of the object lens. A sample image is obtained by use of a scanning electron microscope with the above-described structure.

According to the present invention, an image of unevennesses may be obtained as an image of the surface of a sample in a high-resolution manner and a high contrast one.

DETAILED DESCRIPTION OF THE PREFERRED EMBODIMENTS

Figure 1:
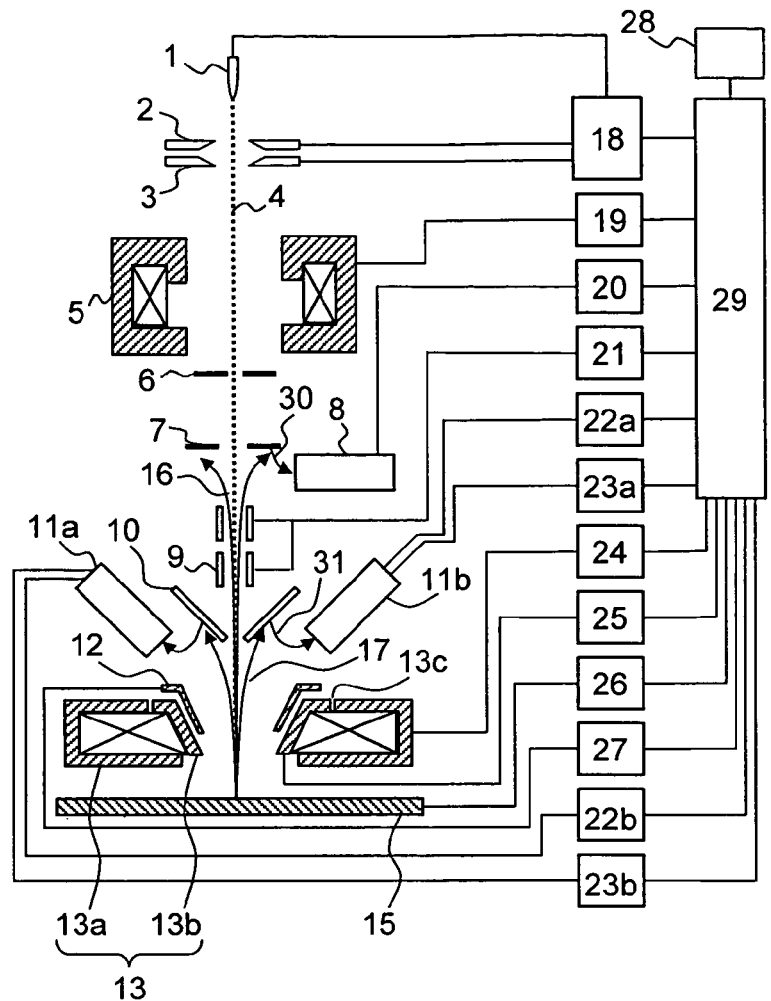
FIG. 1 is a schematic view of the structure of a scanning electron microscope according to the present invention.

FIG. 1 shows one example of a scanning electron microscope according to the present invention. A scanning electron microscope according to the present example has a cathode 1, anodes 2 and 3, a focusing lens 5, a throttle plate 6, a first conductor plate 7, a first detector 8, a deflecting coil 9, a second conductor plate 10, second detectors 11a and 11b, a shielding plate 12, and an object lens 13. A sample 15 is arranged below the object lens 13. A scintillator may be used as an electron detecting unit in the second detectors 11a and 11b.

The scanning electron microscope according to the present example further has a high-voltage control power supply 18 which controls a high voltage applied to between the cathode 1 and the first and second anodes 2, 3; a focusing-lens control power supply 19 which controls a current passing through the focusing lens 5; a first amplifier 20 which amplifies a signal from the first detector 8; a deflecting-coil control section 21 which supplies a scanning signal according to a magnification to the deflecting coil 9; a second amplifier 22a which amplifies a signal from the second detector 11b; a second amplifier 22b which amplifies a signal from the second detector 11a; a detector-apply-voltage control section 23a which controls a voltage applied to the second detector 11b; a detector-apply-voltage control section 23b which controls a voltage applied to the second detector 11a; an object-lens control power supply 24 which controls a current passing through the object lens; an apply-voltage control section 25 which controls a voltage applied to a separate magnetic pole 13b of the object lens; a sample-apply-voltage control section 26 which controls a negative voltage applied to the sample 15; a shielding-plate-apply-voltage control section 27 which controls a voltage applied to the shielding plate 12; a picture display device 28 which displays an enlarged image of the sample 15; and a CPU 29 which controls the whole of the scanning electron microscope.

The object lens 13 is an object lens of a magnetic field leakage type, and a leakage magnetic field is generated above the sample 15 and in the center region of the object lens 13. The object lens 13 is of a separate type, and includes a main magnetic pole 13a and a ring-like separate magnetic pole 13b. A gap 13c is formed between the main magnetic pole 13a and the separate magnetic pole 13b. The apply-voltage control section 25 applies a positive voltage to the separate magnetic pole 13b. Thereby, an acceleration electric field is generated.

The sample-apply-voltage control section 26 applies a negative voltage to the sample 15. Thereby, a deceleration electric field is generated on the sample 15. The shielding-plate-apply-voltage control section 27 applies a negative voltage of zero voltages through several tens voltages to the shielding plate 12.

The detector-apply-voltage control section 23a applies a positive voltage to the second detector 11b, and the detector-apply-voltage control section 23b applies a positive voltage to the second detector 11a. Thereby, a retracting electric field is generated. The functions of the acceleration electric field, the deceleration electric field, and the retracting electric field will be explained later.

Here, there are eliminated drawings for a sample stage holding the sample 15, a conveying system conveying the sample, a vacuum vessel accommodating the scanning electron microscope, and the like.

A primary electron beam 4 ejected from the cathode 1 is accelerated by applying a high voltage to between the cathode 1 and the second anode 3. The primary electron beam 4 is focused by the focusing lens 5, and the throttle plate 6 removes an unnecessary beam region. The primary electron beam 4 passes through the opening of the first conductor plate 7, is two-dimensionally scanned by the deflecting coil 9, and passes through the opening of the second conductor plate 10. The primary electron beam 4 is focused by the object lens 13, and is decelerated by the deceleration electric field on the sample 15 to form a minute spot on the sample 15.

Signal electrons 16 of low energy and signal electrons 17 of high energy are ejected from the sample 15 by irradiating the primary electron beam 4. Here, it is assumed that the energy of the signal electrons 16 of low energy is less than 10 electron volts, and that of the signal electrons 17 of high energy is 10 electron volts or more. The signal electrons 16 of low energy have no directivity in the emitting direction. A picture of the contour of the surface of the sample 15, a boundary between different materials, and the like may be obtained by the signal electrons 16 of low energy, but it is difficult to obtain a clear image of unevennesses. On the other hand, the signal electrons 17 of high energy are emitted in the direction inclined relative to the surface of the sample 15. That is, the signal electrons 17 have directivity in the emitting direction. An image of unevennesses on the surface of the sample 15 may be obtained by the signal electrons 17 of high energy.

The signal electrons 16 of low energy are accelerated in the direction of the object lens 13 by the deceleration electric field of the sample 15, are collected in the direction of the center of the object lens 13 by the leakage magnetic field of the object lens 13, and pass through the center of the object lens 13. After passing through the object lens 13, the signal electrons 16 of low energy collide with the first conductor plate 7. Thereby, secondary electrons 30 are generated. The secondary electrons 30 are detected by the first detector 8. A detection signal from the first detector 8 is amplified in the first amplifier 20, is processed in the CPU 29, and is supplied to the picture display device 28. The picture display device 28 displays an enlarged image of the sample.

The signal electrons 17 of high energy are ejected in the direction inclined relative to the surface of the sample 15, but the electrons 17 are deflected in the direction of the center of the object lens 13 by the leakage magnetic field of the object lens 13. As described above, the signal electrons 17 of high energy pass through the center of the object lens 13 after the orbit of the electrons 17 is deflected. The signal electrons 17 of high energy, which have passed through the object lens 13, are accelerated in the direction of the cathode 1 by the acceleration electric field generated by the magnetic pole 13b. The accelerated signal electrons 17 of high energy may collide with the second conductor plate 10. Thereby, the secondary electrons 31 are generated. The secondary electrons 31 are detected by the second detector 11a or 11b. A detection signal from the second detector 11a is amplified by the second amplifier 22b, and a detection signal from the second detector 11b is amplified by the second amplifier 22a. The amplified detection signals are processed by the CPU 29, and are supplied to the picture display device 28. The picture display device 28 displays an image of unevennesses of the sample.

In this example, not only the signal electrons 17 of high energy, but also the primary electron beam 4 is accelerated by the acceleration electric field generated by the magnetic pole 13b. Accordingly, the aberration of the primary electron beam 4 is reduced to obtain an image of unevennesses in a high-resolution manner. Moreover, the function of the shielding plate 12 provided on the upper side of the object lens 13 will be explained later, referring to FIG. 3A through FIG. 3F.

Hereinafter, there will be explained a case in which a image of minute unevennesses on the surface of the sample may be obtained by using the signal electrons 17 of high energy.

Figure 2:
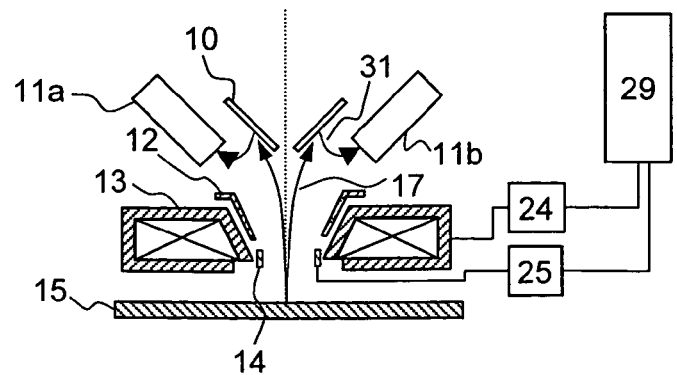
FIG. 2 is a view showing the structure in the vicinity of an object lens in the scanning electron microscope according to the present invention.

A second example of the scanning electron microscope according to the present invention is illustrated, referring to FIG. 2. FIG. 2 shows only a part of the lower portion of the scanning electron microscope. In this example, the object lens 13 is not of a separate type but of an integrated type. A ring-like electrode 14 is provided at the inner lower end of the object lens 13 and at the lower end of the shielding plate 12 instead. A positive voltage is applied to the electrode 14 by the apply-voltage control section 25. Thereby, an acceleration electric field is generated. The electrode 14 has a similar function to that of the magnetic pole 13b.

The signal electrons 17 of high energy, which have been ejected in the direction inclined relative to the surface of the sample 15, are deflected in the direction of the center of the object lens 13 by the leakage magnetic field of the object lens 13. The signal electrons 17 of high energy, which has passed through the center of the object lens 13, are accelerated in the direction of the cathode 1 by the acceleration electric field generated by the electrode 14. The accelerated signal electrons 17 of high energy may collide with the second conductor plate 10. Thereby, the secondary electrons 31 are generated. The secondary electrons 31 are detected by the second detector 11a or 11b. The detection signal from the second detector 11a is amplified by the second amplifier 22b, and the detection signal from the second detector 11b is amplified by the second amplifier 22a. The amplified detection signals are processed by the CPU 29, and are supplied to the picture display device 28. The picture display device 28 displays a clear image of unevennesses of the sample In this example, not only the signal electrons 17 of high energy, but also the primary electron beam 4 is accelerated by the acceleration electric field generated by the electrode 14. Accordingly, the aberration of the primary electron beam 4 is reduced to obtain an image of unevennesses of the sample in a high-resolution manner.

As the secondary particles 31 are pulled in the direction of the acceleration electric field generated by the magnetic pole 13b or the electrode 14, the detection efficiency of the secondary particles 31 is not high. Accordingly, the detection efficiency of the signal electrons 17 of high energy may be improved by providing the shielding plate 12 according to the present invention.

Figure 3:
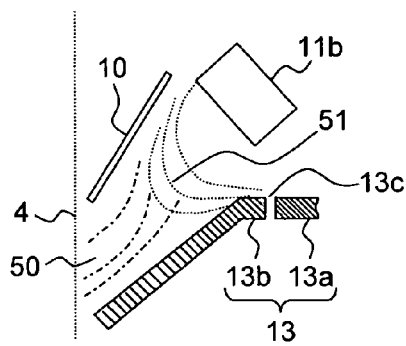
FIG. 3A is an exemplary view for explaining functions of a shielding plate in the scanning electron microscope according to the present invention.
FIG. 3B is an exemplary view for explaining functions of a shielding plate in the scanning electron microscope according to the present invention.
FIG. 3C is an exemplary view for explaining functions of a shielding plate in the scanning electron microscope according to the present invention.
FIG. 3D is an exemplary view for explaining functions of a shielding plate in the scanning electron microscope according to the present invention.
FIG. 3E is an exemplary view for explaining functions of a shielding plate in the scanning electron microscope according to the present invention.
FIG. 3F is an exemplary view for explaining functions of a shielding plate in the scanning electron microscope according to the present invention.
Figure 3:
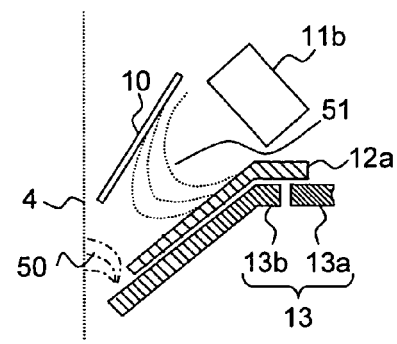
Figure 3:
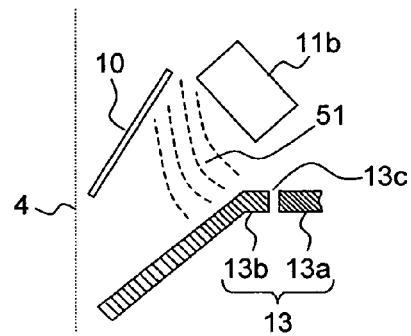
Figure 3:
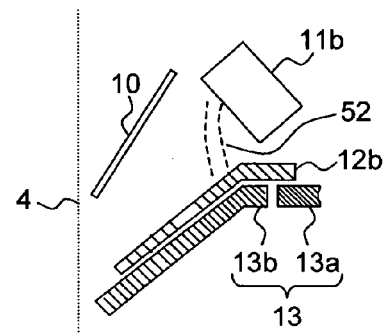
Figure 3:
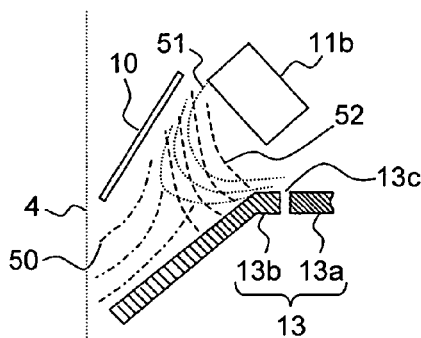
Figure 3:
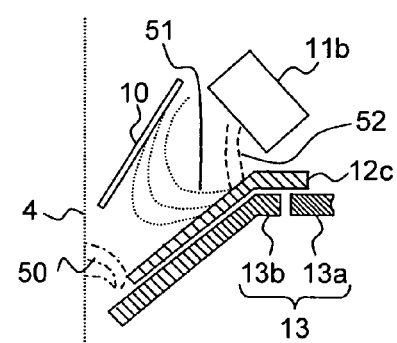

The functions of the shielding plate 12 in the scanning electron microscope according to the present example will be explained in detail, referring to FIG. 3A through FIG. 3F. Here, an electric-field shielding plate 12a, a magnetic-field shielding plate 12b, and an electromagnetic-field shielding plate 12c will be explained as one example of the shielding plate 12. FIG. 3A shows a state in which the shielding plate 12 is removed from the object lens 13 in FIG. 1. An acceleration electric field 50 accelerating the signal electrons of high energy is generated in the space between the second conductor plate 10 and the separate magnetic pole 13b by applying a positive voltage to the separate magnetic pole 13b of the object lens. A retracting electric field 51 with a function to retract the second particle beam 31 into the detector 11a is generated by applying a positive voltage to the second detector 11a, and a retracting electric field 51 with a function to retract the second particle beam 31 into the detector 11b is generated by applying a positive voltage to the second detector 11b. Accordingly, both the acceleration electric field 50 and the retracting electric field 51 exist above the object lens 13. However, the strength of the acceleration electric field 50 is larger than that of the retracting electric field 51 in the vicinity of the end F of the second conductor plate 10. Accordingly, the secondary electrons 31 generated from the second conductor plate 10 are pulled by the acceleration electric field 50, and are retracted in the direction of the object lens. Therefore, the number of the signal electrons 17 of high energy is reduced, so that a sharp image of unevennesses cannot be obtained, wherein the signal electrons 17 are detected by the detector 11a or 11b.

Accordingly, as shown in FIG. 3B, the electric-field shielding plate 12a of conductive non-magnetic material is provided on the upper side of the object lens 13 according to the present invention. The acceleration electric field 50 and the retracting electric field 51 are generated above the object lens 13. However, the acceleration electric field 50 is obstructed by the electric-field shielding plate 12a, and does not exist above the object lens 13. The retracting electric field 51 becomes predominant above the object lens 13. The secondary electrons 31 generated from the second conductor plate 10 are pulled in the direction of the secondary detector 11a or 11b by the retracting electric field 51. The number of the signal electrons 17 of high energy is increased, so that a sharp image of unevennesses may be obtained, wherein the signal electrons 17 are detected by the detector 11a or 11b.

FIG. 3C shows a state in which the shielding plate 12 is removed from the object lens 13 in FIG. 1 in a similar manner to that of FIG. 3A. The influence of the gap 13c between the magnetic pole 13a and the magnetic pole 13b of the object lens has been neglected in the example of FIG. 3A. Actually, the existence of the gap 13c generates a magnetic gap between the magnetic pole 13a and the magnetic pole 13b. Thereby, a magnetic field 52 is generated in the space between the second conductor plate 10 and the magnetic pole 13b. Therefore, the secondary electrons 31 generated from the second conductor plate 10 are deflected by the Lorentz force due to the magnetic field 52 to cause a state in which an efficiency at which the electrons 31 reach the second detector 11a or 11b is not high. Therefore, the number of the signal electrons 17 of high energy is reduced, so that a sharp image of unevennesses cannot be obtained, wherein the signal electrons 17 are detected by the detector 11a or 11b.

Accordingly, as shown in FIG. 3D, the magnetic-field shielding plate 12b of magnetic material is provided on the upper side of the object lens 13 according to the present invention. Though the magnetic field 52 is generated above the object lens 13, the field 52 is obstructed by the magnetic-field shielding plate 12b. Accordingly, the deflection of the orbit of the secondary electrons 31 by the magnetic field is controlled. The number of the signal electrons 17 of high energy is increased, so that a sharp image of unevennesses may be obtained, wherein the signal electrons 17 are detected by the detector 11a or 11b.

FIG. 3E shows a state in which the shielding plate 12 is removed from the object lens 13 in FIG. 1 in a similar manner to that of FIG. 3A. The acceleration electric field 50 is generated by applying a positive voltage to the separate magnetic pole 13b of the object lens, and the retracting electric field 51 is generated by applying a positive voltage to the second detectors 11a and 11b. The magnetic field 52 is generated by the magnetic gap caused by the gap 13c. The strength of the acceleration electric field 50 is larger than that of the retracting electric field 51. The signal electrons 17 of high energy are detected by the detector 11a or 11b, and the number of the electrons 17 is reduced by the effect of the acceleration electric field 50 and that of the magnetic field 52. Accordingly, a sharp image of unevennesses can hardly be obtained.

Therefore, as shown in FIG. 3F, the electromagnetic-field shielding plate 12c of magnetic material is provided on the upper side of the object lens 13 according to the present invention. The acceleration electric field 50, the retracting electric field 51, and the magnetic field 52 are generated above the object lens 13. However, the acceleration electric field 50 is obstructed by the electromagnetic-field shielding plate 12c, and the retracting electric field 51 becomes predominant. The magnetic field 52 is obstructed by the electromagnetic-field shielding plate 12c, and the effect of the magnetic field 52 may be controlled. Accordingly, the secondary electrons 31 generated from the second conductor plate 10 are pulled by the retracting electric field 51 in the direction of the second detector 11a or 11b. The number of the signal electrons 17 of high energy is increased, so that a sharp image of unevennesses may be obtained, wherein the signal electrons 17 are detected by the detector 11a or 11b.

The above has explained the case of the object lens 13 of a separate type, wherein the lens 13 is shown in FIG. 1. The acceleration electric field 50 leaks out on the upper side of the object lens 13, even when the electrode 14 is provided, using the object lens 13 of an integrated type, wherein the lens 13 is shown in FIG. 2. Moreover, the magnetic field 52 slightly leaks out too, and the shielding plate 12 with the above-described configuration is acceptable.

Figure 4:
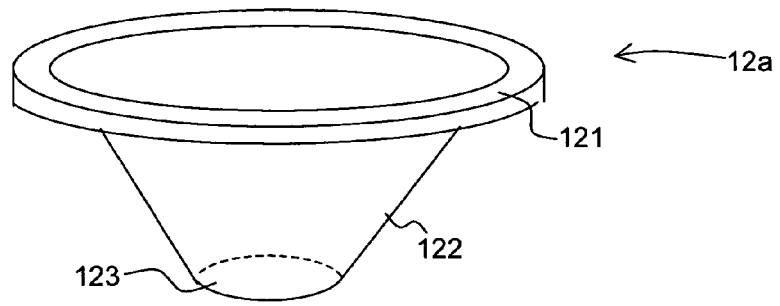
FIG. 4 is a view showing one example of a shielding plate according to the present invention.

The shapes of the electric field shielding plate 12a, the magnetic field shielding plate 12b, and the electromagnetic field shielding plate 12c will be explained, referring to FIG. 4. The electric field shielding plate 12a, the magnetic field shielding plate 12b, and the electromagnetic field shielding plate 12c may have the same shape. Here, the shape of the electric field shielding plate 12a will be explained. The electric field shielding plate 12a, like a coffee drip filter, has an axisymmetric shape with respect to an optical axis. That is, the shielding plate 12a has a ring-like upper end portion 121, a conical side face 122, and an opening portion 123 at the lower end.

When the diameter of the opening portion 123 is too large, a shielding function by which the acceleration electric field 50 is shielded may not be realized. However, one function of the acceleration electric field 50, by which the signal electrons 17 of high energy are accelerated, may not be realized, when the diameter of the opening portion 123 is too small. Accordingly, it is preferable that the diameter of the opening portion 123 is 20 mm or more. The distance between the electric field shielding plate 12a and the separate magnetic pole 13b is required to be of the order in such a manner as not to be discharged.

It was found in experiments conducted by the inventor that the efficiency at which the secondary electrons 31 generated from the second conductor plate 10 were detected was improved by applying a negative voltage of zero volts through several tens voltages to the electric field shielding plate 12a by the shielding-plate-apply-voltage control section 27. Similarly, it was found that the efficiency at which the secondary electrons 31 generated from the second conductor plate 10 were detected was improved by applying a negative voltage of zero volts through several tens voltages to the electromagnetic field shielding plate 12c.

Preferably, SUS316 stainless steel is used as a material for the electric field shielding plate 12a. It is preferable to use ferrite as a material for the magnetic field shielding plate 12b. Preferably, permalloy and pure iron are used as a material for the electromagnetic field shielding plate 12c.

Figure 5:
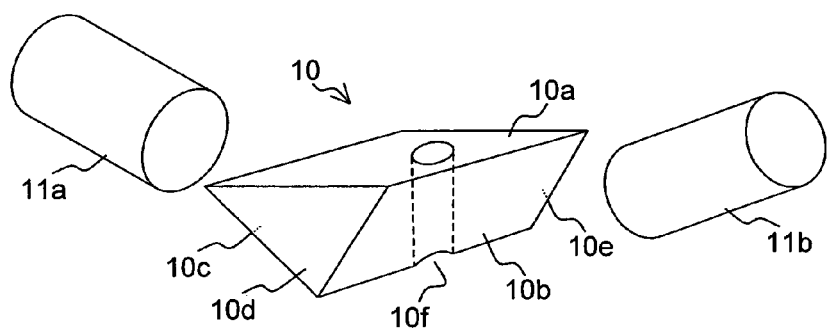
FIG. 5 is a view showing a relation between the position of a conductor plate and that of a detector in the scanning electron microscope according to the present invention.

The structure of the second conductor plate 10 will be explained, referring to FIG. 5. The second conductor plate 10 according to the present example has a shape of a transversely-arranged triangular prism, and consists of a horizontal upper surface 10a, two inclined under surfaces 10b and 10c, and two vertical side surfaces 10d and 10e. Moreover, a hole 10f with a circular cross section is formed along an optical axis. The second detectors 11a and 11b are arranged on both sides of the second conductor plate 10. The second conductor plate 10 and the second detectors 11a and 11b have a plane-symmetry structure with regard to a vertical plane including the optical axis.

The second detectors 11a and 11b are arranged in such a way that the extension line of the optical axis of the detector 11a and the under surface 10c of the second conductor plate 10 cross each other, and the extension line of the optical axis of the detector 11b and the under surface 10b of the conductor plate 10 cross each other. Accordingly, the secondary electrons 31 generated from the under-surface 10b of the second conductor plate 10 may be detected by the second detector 11b, and the secondary electrons 31 generated from the under-surfaces 10c of the conductor plate 10 may be detected by the second detector 11a.

In the present example, the signal electrons 17 of high energy, which have been generated from the sample, are irradiated onto the two under surfaces 10b and 10c of the second conductor plate 10. That is, half of the signal electrons 17 of high energy are irradiated onto one under surface 10b to generate the secondary electrons 31. The other half of the signal electrons 17 of high energy are irradiated onto the other under surface 10c to generate the secondary electrons 31. The secondary electrons 31 generated from the under surface 10b are detected by the second detector 11b, and the secondary electrons 31 generated from the under surface 10c are detected by the second detector 11a. As described above, the detection signals are evenly obtained by the two second detectors 11a and 11b by arranging the second conductor plate 10 and the second detectors 11a and 11b in such a way that a plane-symmetry structure is formed with regard to a vertical plane including the optical axis. Accordingly, an image of unevennesses may be symmetrically obtained.

The passage of the primary electron beam 4 from the cathode 1 to the surface of the sample 15 is required to be axisymmetric with regard to the optical axis. If the passage of the primary electron beam 4 has no axisymmetric structure, the electric field formed there has a non-axisymmetric structure with regard to the optical axis. When force from the non-axisymmetric electric field is applied to the primary electron beam 4 deflected by the deflecting coil 9, image deformation is caused in the sample image.

The hole 10f in the second conductor plate 10 forms the passage of the primary electron beam 4. The inside of the hole 10f has an axisymmetric structure with respect to the optical axis. Accordingly, the electric field formed in the hole 10f is axisymmetric with respect to the optical axis. However, the two under-surfaces 10b and 10c are arranged in the vicinity of the opening at the lower end of the hole 10f. That is, the shape in the vicinity of the opening at the lower end of the hole 10f is not axisymmetric with respect to the optical axis. Accordingly, the electric field in the vicinity of the opening at the lower end of the hole 10f is not axisymmetric.

Figure 6:
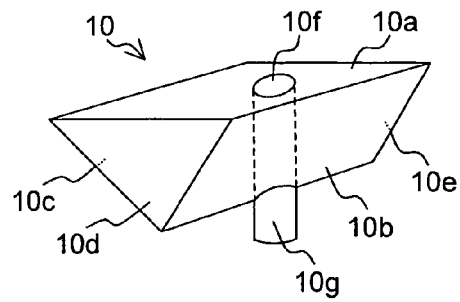
FIG. 6 is a view showing another example of the conductor plate in the scanning electron microscope according to the present invention.

In the example shown in FIG. 6, a cylindrical conductor tube 10g is installed to the opening at the lower end of the hole 10f in the second conductor plate 10. The conductor tube 10g is extending in such a way that it projects downward from the lower end of the hole 10f in the second conductor plate 10. The space in the vicinity of the opening at the lower end of the conductor tube 10g is away from the two under surfaces 10b and 10c to form an axisymmetric space. Accordingly, the electric field in the vicinity of the opening at the lower end of the conductor tube 10g is axisymmetric to cause no image deformation in the sample image.

Figure 7:
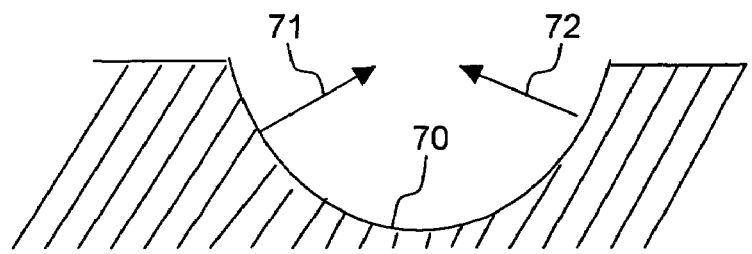
FIG. 7A is an exemplary view for explaining one example in which an image of a concave portion on the surface of a sample is picked up by the scanning electron microscope according to the present invention.
FIG. 7B is an exemplary view for explaining the example in which the image of the concave portion on the surface of the sample is picked up by the scanning electron microscope according to the present invention.
FIG. 7C is an exemplary view for explaining the example in which the image of the concave portion on the surface of the sample is picked up by the scanning electron microscope according to the present invention.
Figure 7:
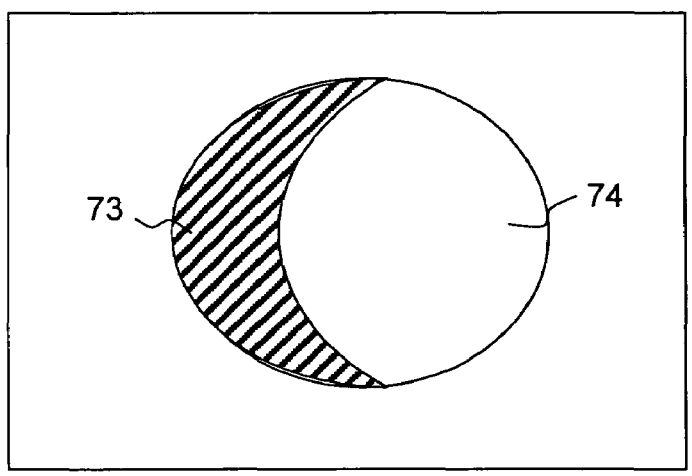
Figure 7:
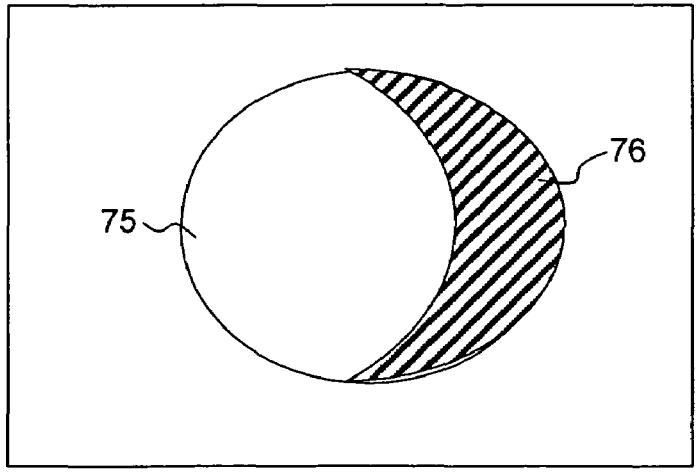

Referring to FIG. 7A through FIG. 7C, there will be explained a method by which an image of a concave portion on the surface of the sample is generated by use of the scanning electron microscope according to the present example. FIG. 7A shows a sectional view of the structure of a concave portion 70 on the surface of the sample. FIG. 7B shows an image of the concave portion, which has been obtained by the detector 11a at the left side. The detector 11a at the left side detects signal electrons 72 of high energy, which have been ejected from the surface of the sample 15 in the left direction. Accordingly, the detector 11a at the left side does not detect signal electrons 71 of high energy, which have been ejected from the left-side portion of the concave portion 70, though the detector 11a at the left side detects the signal electrons 72 of high energy, which have been ejected from the right-side portion of the concave portion 70. The right-side portion 74 in the image of the concave portion 70 is bright, and the left-side portion 73 therein is dark. FIG. 7C shows an image of the concave portion 70, which has been obtained by the detector 11b at the right side. The detector 11b at the right side detects the signal electrons 71 of high energy, which have been ejected from the surface of the sample 15 in the right direction. Accordingly, the detector 11b at the right side does not detect the signal electrons 72 of high energy, which have been ejected from the right-side portion of the concave portion, though the detector 11b at the right side detects the signal electrons 71 of high energy, which have been ejected from the left-side portion of the concave portion. The left-side portion 75 in the image of the concave portion 70 is bright, and the right-side portion 76 therein is dark.

Figure 8:
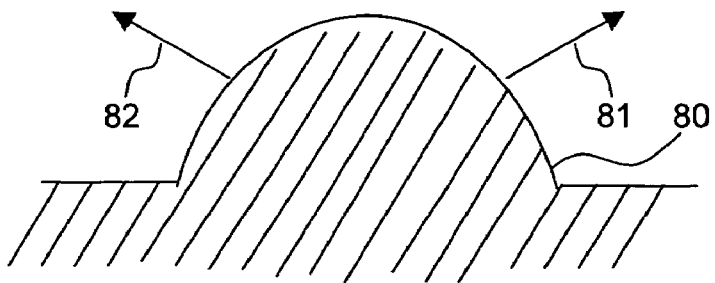
FIG. 8A is an exemplary view for explaining one example in which an image of a convex portion on the surface of a sample is picked up by the scanning electron microscope according to the present invention.
FIG. 8B is an exemplary view for explaining the example in which the image of the convex portion on the surface of the sample is picked up by the scanning electron microscope according to the present invention.
FIG. 8C is an exemplary view for explaining the example in which the image of the concave portion on the surface of the sample is picked up by the scanning electron microscope according to the present invention.
Figure 8:
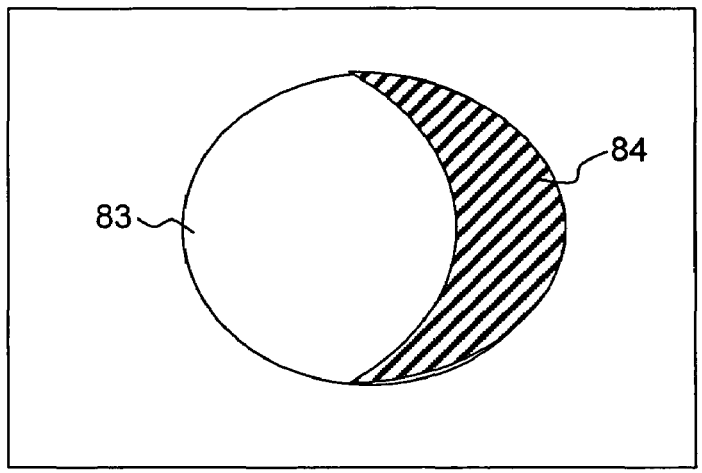
Figure 8:
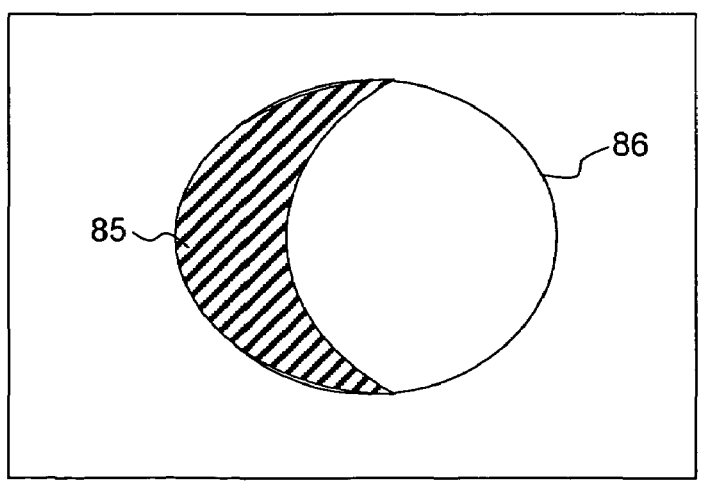

Referring to FIG. 8A through FIG. 8C, there will be explained a method by which an image of a convex portion on the surface of the sample is generated by use of the scanning electron microscope according to the present example. FIG. 8A shows a sectional view of the structure of a convex portion 80 on the surface of the sample. FIG. 8B shows an image of the convex portion 80, which has been obtained by the detector 11a at the left side. The detector 11a at the left side detects signal electrons 82 of high energy, which have been ejected from the surface of the sample 15 in the left direction. Accordingly, the detector 11a at the left side does not detect signal electrons 81 of high energy, which have been ejected from the right-side portion of the convex portion, though the detector 11a at the left side detects the signal electrons 82 of high energy, which have been ejected from the left-side portion of the convex portion. The right-side portion 84 in the image of the convex portion 80 is dark, and the left-side portion 83 therein is bright. FIG. 8C shows an image of the convex portion 80, which has been obtained by the detector 11b at the right side. The detector 11b at the right side detects the signal electrons 81 of high energy, which have been ejected from the surface of the sample 15 in the right direction. Accordingly, the detector 11b at the right side does not detect the signal electrons 82 of high energy, which have been ejected from the left-side portion of the convex portion, though the detector 11b at the right side detects the signal electrons 81 of high energy, which have been ejected from the right-side portion of the convex portion. The left-side portion 85 in the image of the convex portion 80 is dark, and the right-side portion 86 therein is bright.

Though the examples according to the present invention have been explained in the above description, it will be easily appreciated by persons skilled in the art that the present invention is not limited to the above-described examples, but various variations may be possible without departing from the scope of the invention as defined in the appended claims.

What is claimed is:

1. A scanning electron microscope, having:
    an electron source which generates a primary electron beam;
    an object lens by which said primary electron beam is focused onto a sample;
    a conductor plate, with which signal electrons which have a high energy of 10 electron volts or more and have been generated from said sample, collide;
    two detectors which detect secondary electrons, which have been generated from said conductor plate;
    an acceleration-electric-field generating unit which generates an acceleration electric field between said object lens and said conductor plate, wherein said signal electrons are accelerated by said acceleration electric field; and
    a shielding plate arranged on the upper side of said object lens.

2. The scanning electron microscope according to claim 1, wherein
    said object lens is of a separate type, and consists of a separate pole in the center side region and a main pole in the outside region, and
    said acceleration-electric-field generating unit is formed by said separate pole.

3. The scanning electron microscope according to claim 2, wherein
    said shielding plate is an electric field shielding plate by which said acceleration electric field is controlled.

4. The scanning electron microscope according to claim 2, wherein
    said shielding plate is a magnetic field shielding plate by which a magnetic field caused by a magnetic gap generated by the space between said two magnetic poles is controlled.

5. The scanning electron microscope according to claim 2, wherein
    said shielding plate is an electromagnetic field shielding plate by which a magnetic field caused by a magnetic gap generated by the space between said two magnetic poles is controlled, and said acceleration electric field is controlled.

6. The scanning electron microscope according to claim 1, wherein
    said acceleration-electric-field generating unit is formed by a ring-like electrode provided in the inner side of said object lens.

7. The scanning electron microscope according to claim 6, wherein
    said shielding plate is an electric field shielding plate by which said acceleration electric field is controlled.

8. The scanning electron microscope according to claim 6, wherein
    said shielding plate is a magnetic field shielding plate by which a magnetic field caused by a magnetic gap generated by the space between said two magnetic poles is controlled.

9. The scanning electron microscope according to claim 6, wherein
    said shielding plate is an electromagnetic field shielding plate by which a magnetic field caused by a magnetic gap generated by the space between said two magnetic poles is controlled, and said acceleration electric field is controlled.

10. The scanning electron microscope according to claim 1, wherein
    said object lens generates a leakage magnetic field by which said signal electrons are deflected in the direction of the center of said object lens.

11. The scanning electron microscope according to claim 1, wherein
    a positive voltage is applied to said detectors in order to generate a retracting electric field by which said signal electrons are retracted.

12. The scanning electron microscope according to claim 1, wherein
    a negative voltage is applied to said sample in order to generate a deceleration electric field by which said primary electrons are decelerated.

13. The scanning electron microscope according to claim 1 wherein
    a negative voltage is applied to said shielding plate.

14. The scanning electron microscope according to claim 1, wherein
    said shielding plate has a ring-like upper end portion, a conical side face, and an opening portion at the lower end.

15. The scanning electron microscope according to claim 1, wherein
    said two detectors are arranged on both sides of said conductor plate, and said conductor plate and said two detectors form a plane-symmetry structure with regard to a plane including the optical axis of said scanning electron microscope.

16. The scanning electron microscope according to claim 1, wherein
said conductor plate has a center hole as the passage of said primary electron beam and two planes with which said signal electrons collide, and
said two detectors are arranged in such a way that secondary electrons generated from said two planes may be detected.

17. The scanning electron microscope according to claim 16, wherein
a cylindrical component is provided at the lower end of the center hole in said conductor plate.

18. An apparatus for detecting a defect, which has a scanning electron microscope and a picture display device, wherein
said scanning electron microscope has: an electron source which generates a primary electron beam; an object lens by which said primary electron beam is focused onto a sample; a conductor plate, with which signal electrons which have a high energy of 10 electron volts or more and have been generated from said sample, collide; a first and a second detectors which detect secondary electrons, which have been generated from said conductor plate; an acceleration-electric-field generating unit which generates an acceleration electric field between said object lens and said conductor plate, wherein said signal electrons are accelerated by said acceleration electric field; and a shielding plate arranged on the upper side of said object lens,
said object lens generates a leakage magnetic field by which said signal electrons are deflected in the direction of the center of said object lens, and
a positive voltage is applied to said detectors in order to generate a retracting electric field by which said signal electrons are retracted.

19. The apparatus for detecting a defect according to claim 18, wherein
said shielding plate is an electric field shielding plate by which said acceleration electric field is controlled.

20. The apparatus for detecting a defect according to claim 18, wherein
a negative voltage is applied to said sample in order to generate a deceleration electric field by which said primary electrons are decelerated.

21. The apparatus for detecting a defect according to claim 18, wherein,
a negative voltage is applied to said shielding plate.

22. A method by which a sample image is obtained by use of a scanning electron microscope, having steps of:
focusing a primary electron beam from an electron source by use of an object lens to form a minute spot on a sample;
leading signal electrons generated from said sample to collide with a conductor plate;
detecting secondary electrons, which have been generated from said conductor plate, by a detector;
generating an acceleration electric field between said object lens and said conductor plate, wherein said signal electrons are accelerated by said acceleration electric field; and
arranging a shielding plate on the upper side of said object lens.

23. The method by which a sample image is obtained by use of a scanning electron microscope according to claim 22, having steps of:
generating a deceleration electric field by applying a negative voltage to said sample, wherein said primary electrons are decelerated by said deceleration electric field; and
applying a negative voltage to said shielding plate.

* * * * *